United States Patent
Lin et al.

(10) Patent No.: US 7,375,453 B2
(45) Date of Patent: May 20, 2008

(54) SURFACE ACOUSTIC WAVE SUBSTRATE

(75) Inventors: I-Nan Lin, Taipei (TW); Jin-Hua Huang, Hsinchu (TW); Cheng-Hsien Chou, Tainan (TW)

(73) Assignee: Tamkang University, Taipei (TW)

( * ) Notice: Subject to any disclaimer, the term of this patent is extended or adjusted under 35 U.S.C. 154(b) by 51 days.

(21) Appl. No.: 11/542,613

(22) Filed: Oct. 2, 2006

(65) Prior Publication Data

US 2007/0228873 A1     Oct. 4, 2007

(30) Foreign Application Priority Data

Apr. 3, 2006 (TW) .............................. 95111786 A

(51) Int. Cl.
*H03H 9/25* (2006.01)
(52) U.S. Cl. ................................... 310/313 R
(58) Field of Classification Search ............ 310/313 R
See application file for complete search history.

(56) References Cited

U.S. PATENT DOCUMENTS 6,858,969 B2    2/2005    Bi et al.
7,095,157 B2 *  8/2006    Sung ...................... 310/313 R

FOREIGN PATENT DOCUMENTS

| JP | 5183377 | * | 7/1993 |
| JP | 8316782 | * | 11/1996 |
| JP | 2001196896 | * | 7/2001 |
| WO | WO/89/08949 | * | 9/1989 |

OTHER PUBLICATIONS

V. Mortet, et al., Surface acoustic wave propagation in aluminum nitride-unpolished freestanding diamond structures, Applied Physics Letters, vol. 81, No. 9, Aug. 26, 2002, pp. 1720-1722.
G. Vogg, et al., High quality heteroepitaxial AlN films on diamond, Journal of Applied Physics, vol. 96, No. 1, Jul. 1, 2004, pp. 895-902.

* cited by examiner

*Primary Examiner*—Thomas M. Dougherty
(74) *Attorney, Agent, or Firm*—Darby & Darby P.C.

(57) ABSTRACT

A surface acoustic wave substrate includes: a diamond layer; a piezoelectric layer of aluminum nitride; and a titanium nitride-based buffer layer sandwiched between the diamond layer and the piezoelectric layer. The titanium nitride-based buffer layer includes a graded structure or includes a first sub-layer of titanium and a second sub-layer of titanium nitride sandwiched between the first sub-layer and the piezoelectric layer.

9 Claims, 7 Drawing Sheets

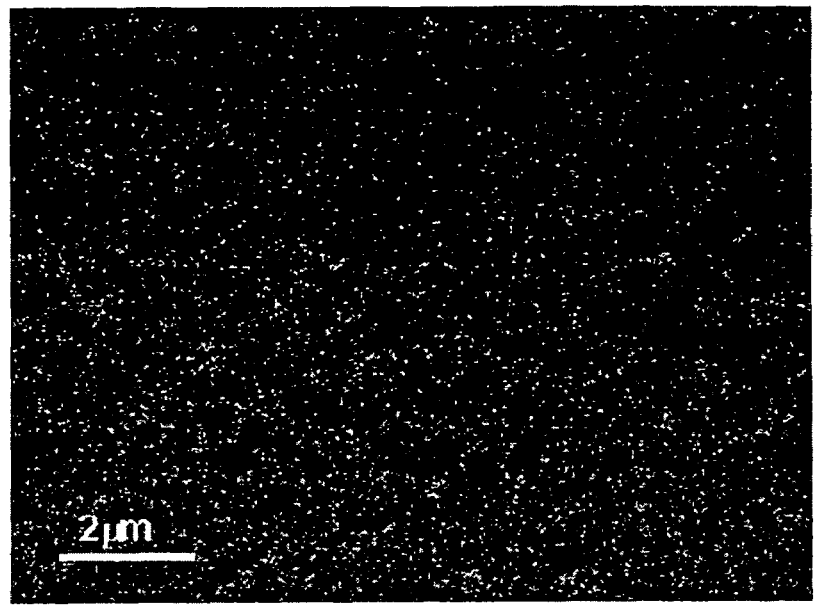
F I G. 3
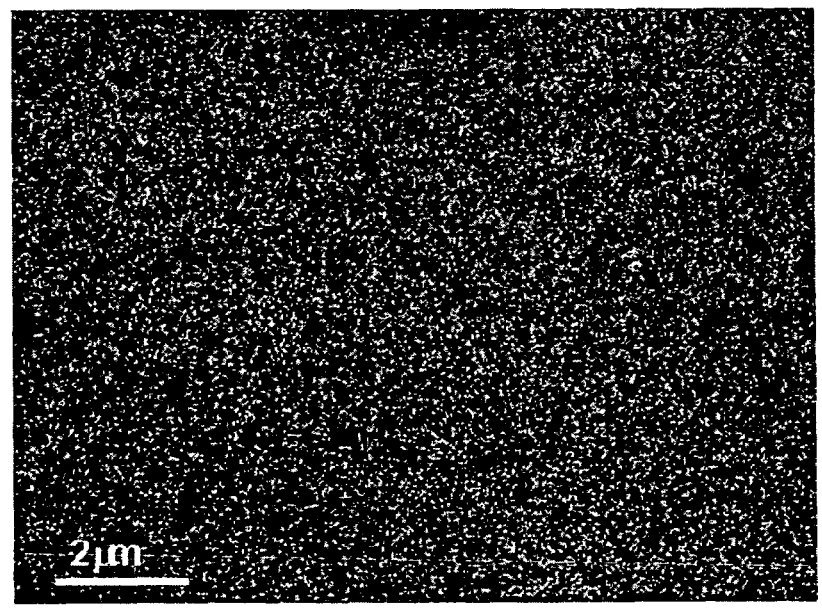
F I G. 4

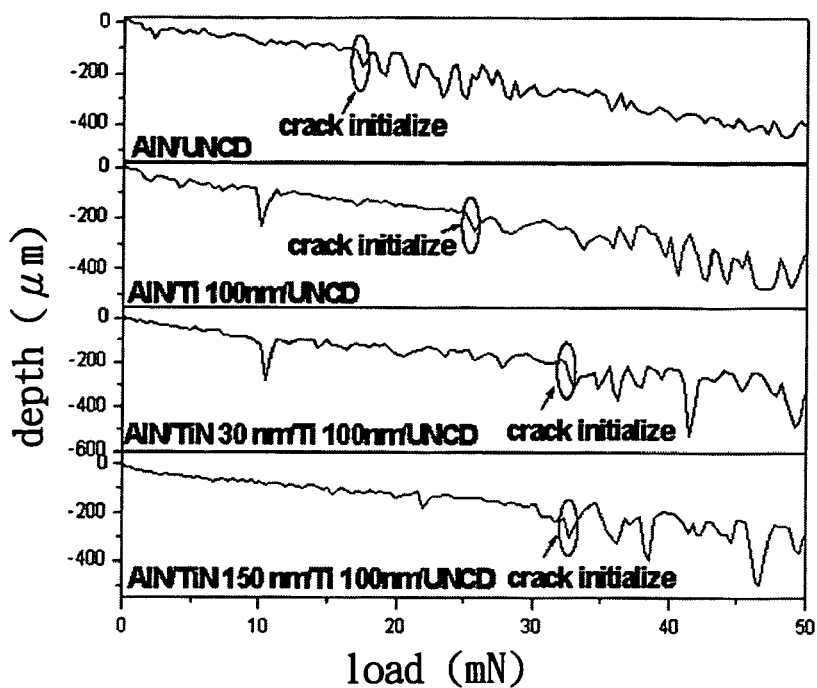
F I G. 8
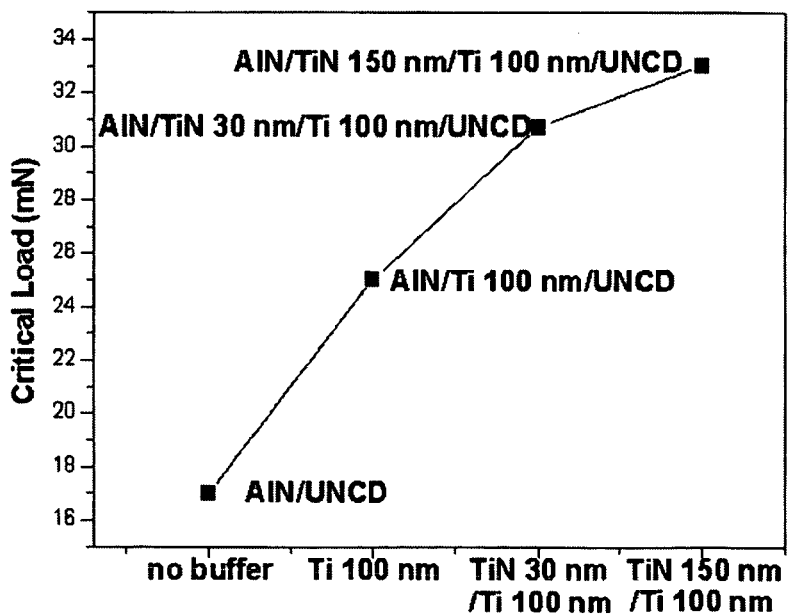
F I G. 9

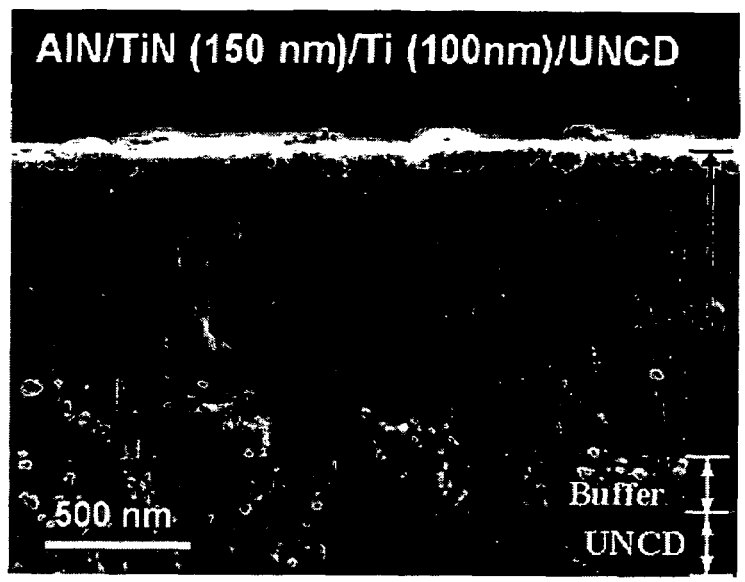
F I G. 10
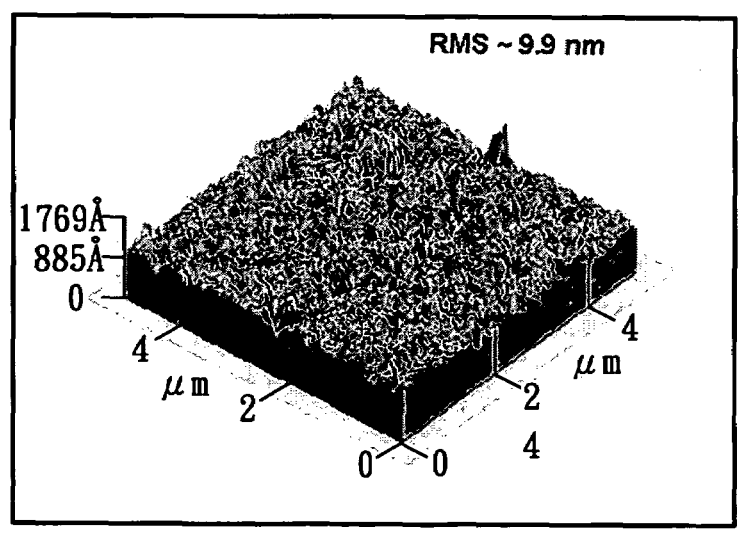
F I G. 11

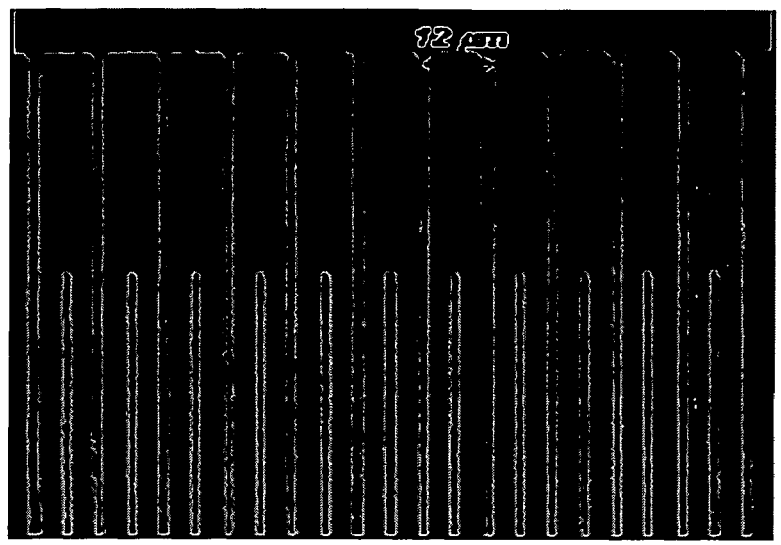
F I G. 12
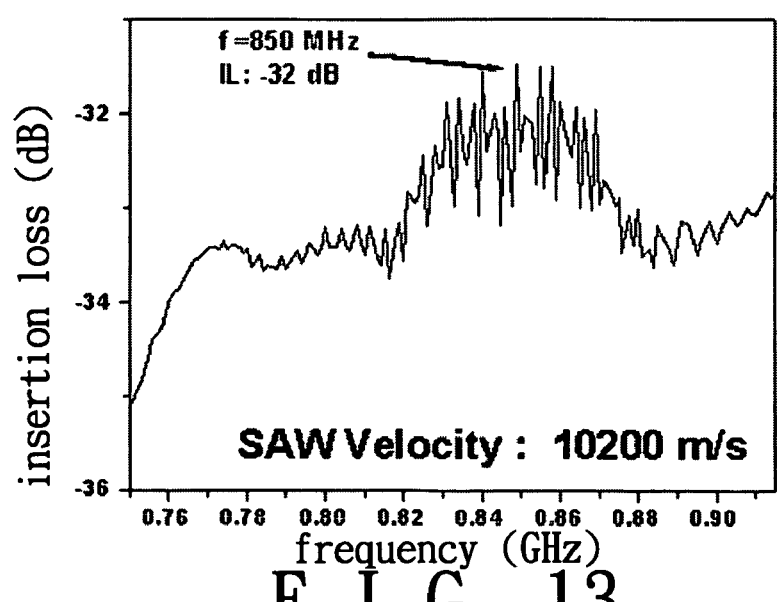
F I G. 13

SURFACE ACOUSTIC WAVE SUBSTRATE

CROSS-REFERENCE TO RELATED APPLICATION

This application claims priority of Taiwanese Application No. 095111786, filed on Apr. 3, 2006.

BACKGROUND OF THE INVENTION

1. Field of the Invention

This invention relates to a surface acoustic wave substrate, more particularly to a surface acoustic wave substrate having a titanium nitride-based buffer layer sandwiched between a diamond layer and a piezoelectric layer.

2. Description of the Related Art

Since diamond exhibits a high acoustic velocity and thermal conductivity at room temperature, and since highly textured crystalline aluminum nitride (AlN) possesses piezoelectric characteristics, a high resistivity, a high breakdown voltage, and a high acoustic velocity, combination of aluminum nitride and diamond has been proposed for serving as a surface acoustic wave (SAW) substrate. Mortet, et al. (Appl. Phys. Lett., Vol. 81, (9), 1720, 2002), disclosed an approach in which a highly textured crystalline AlN film can be achieved by forming the AlN film on a smooth back side of a diamond film. Vogg, et al. (J. Appl. Phys, 96, (1), 895, 2004), disclosed another approach in which a highly textured AlN film can be achieved by forming the AlN film on a diamond film using Molecular Beam Epitaxy techniques. However, adhesion of the thus formed AlN film on the diamond film is relatively poor. As a consequence, delamination can easily occur for the AlN film, particularly when the layer thickness of the AlN film is greater than 2 μm.

U.S. Pat. No. 6,858,969 discloses a surface acoustic wave device (SAW device) that includes a Si substrate, a nanocrystalline diamond film formed on the Si substrate, metal electrodes formed on the diamond film, and piezoelectric composition coatings formed on the diamond film and the metal electrodes. The SAW device suffers the aforesaid delamination drawback for the metal electrodes and the piezoelectric composition coatings.

SUMMARY OF THE INVENTION

The object of the present invention is to provide a SAW substrate that includes a graded structure of a titanium nitride layer or a layered structure of a titanium layer and a titanium nitride layer to enhance the adhesion between the aluminum nitride film and the diamond film so as to overcome the aforesaid drawback of the prior art.

According to this invention, there is provided a SAW substrate that comprises: a diamond layer; a piezoelectric layer of aluminum nitride; and a titanium nitride-based buffer layer sandwiched between the diamond layer and the piezoelectric layer.

BRIEF DESCRIPTION OF THE DRAWINGS

Other features and advantages of the present invention will become apparent in the following detailed description of the preferred embodiments of this invention, with reference to the accompanying drawings, in which:

FIG. 3 is a scanning electron microscopy (SEM) photomicrograph of an aluminum nitride (AlN) layer of the second preferred embodiment, with the layer thickness of a second sub-layer of titanium nitride of a buffer layer being 30 nm;

FIG. 4 is a SEM photomicrograph of an aluminum nitride (AlN) layer of the second preferred embodiment, with the layer thickness of the second sub-layer of the buffer layer being 150 nm;

FIGS. 8 and 9 are loading test graphs for the first and second preferred embodiments and the first and second comparative examples;

FIG. 10 is a SEM photomicrograph of a cross-section of an aluminum nitride (AlN) layer of the second preferred embodiment, with the layer thickness of the second sub-layer of the buffer layer being 150 nm;

FIG. 11 is an atomic force microscopy (AFM) image of the second preferred embodiment, with the layer thickness of the second sub-layer of the buffer layer being 150 nm;

FIG. 12 is a photomicrograph of a transducer-forming surface of the aluminum nitride layer of the second preferred embodiment, with the layer thickness of the second sub-layer of the buffer layer being 150 nm; and FIG. 13 is an insertion loss vs. frequency graph for the second preferred embodiment, with the layer thickness of the second sub-layer of the buffer layer being 150 nm.

DETAILED DESCRIPTION OF THE PREFERRED EMBODIMENTS

Figure 1:
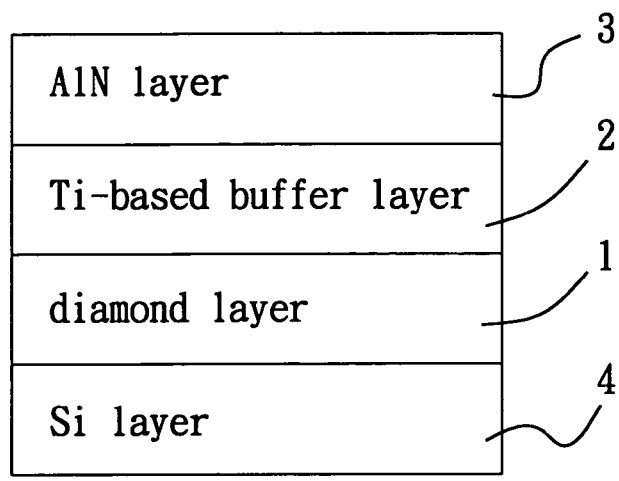
FIG. 1 is a schematic view of the first preferred embodiment of a surface acoustic wave substrate according to this invention.

Before the present invention is described in greater detail, it should be noted that same reference numerals have been used to denote like elements throughout the specification.

FIG. 1 illustrates the first preferred embodiment of a surface acoustic wave (SAW) substrate according to this invention. The surface acoustic wave substrate includes: a N-type silicon layer 4; a diamond layer 1 formed on the silicon layer 4; a piezoelectric layer 3 of aluminum nitride (AlN); and a titanium nitride-based buffer layer 2 sandwiched between the diamond layer 1 and the piezoelectric layer 3. In this embodiment, the titanium nitride-based buffer layer 1 is in the form of a graded structure of titanium nitride which is represented by $TiN_x$, where x preferably approximates 1 at one side of the titanium nitride-based buffer layer 2 that is adjacent to the piezoelectric layer 3, and preferably approximates to zero at an opposite side of the titanium nitride-based buffer layer 2 that is adjacent to the diamond layer 1.

In this embodiment, the titanium nitride-based buffer layer 2 preferably has a layer thickness ranging from 30 to 300 nm.

Figure 2:
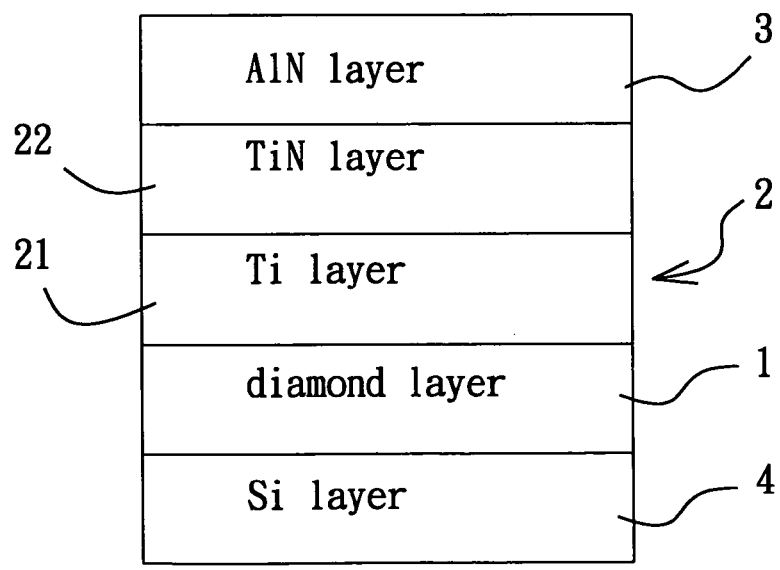
FIG. 2 is a schematic view of the second preferred embodiment of the surface acoustic wave substrate according to this invention.

FIG. 2 illustrates the second preferred embodiment of the SAW substrate according to this invention. The SAW substrate of this embodiment differs from the first preferred embodiment in that the titanium nitride-based buffer layer 2 includes a first sub-layer 21 of titanium and a second sub-layer of titanium nitride 22 sandwiched between the first sub-layer 21 and the piezoelectric layer 3. The first sub-layer 21 is sandwiched between the diamond layer 1 and the second sub-layer 22. In a similar manner as the previous embodiment, the second sub-layer 22 of titanium nitride can have a graded structure.

The first sub-layer 21 preferably has a layer thickness ranging from 10 to 300 nm, whereas the second sub-layer 22 preferably has a layer thickness ranging from 30 to 300 nm and more preferably ranging from 100 to 200 nm. In this embodiment, the first sub-layer 21 has a layer thickness of 100 nm and the second sub-layer 22 has a layer thickness of 30 nm.

It was found by the applicants that, while species such as titanium, tungsten, molybdenum, and the like possess excellent adhesion to the diamond layer 1, they have poor or insufficient adhesion to the aluminum nitride of the piezoelectric layer 3. It was also found by the applicants that, among these species, only titanium can be formed into titanium nitride which has an excellent adhesion to both the aluminum nitride and titanium. Hence, the feature of this invention resides in using a graded structure of a titanium nitride layer or a layered structure of a titanium layer and a titanium nitride layer to enhance the adhesion between the piezoelectric layer 3 and the diamond layer 1.

In addition, not only can the titanium nitride-based buffer layer 2 enhance adhesion between the diamond layer 1 and the piezoelectric layer 3, it can also considerably improve seeding capability on growing a highly oriented crystal film (i.e., c-axis or (002) oriented film) of the aluminum nitride on the diamond layer 1 as compared to the conventional SAW substrate which is one where the aluminum nitride is directly formed on the diamond film. It is known in the art that the higher the degree of the orientation of the crystal the better will be the piezoelectric property thereof. In addition, the titanium nitride-based buffer layer 2 exhibits a high acoustic velocity and a high thermal conductivity.

The following examples and comparative examples illustrate the merits of the SAW substrate of this invention.

COMPARATIVE EXAMPLE 1

An ultranano-crystalline diamond (UNCD) layer was formed on an N-type (100) oriented silicon base layer using a 2.45 GHz plasma enhanced chemical vapor deposition (PECVD) system and bias enhanced nucleation (BEN) techniques. The deposition conditions were conducted under a microwave power of 1.5 kW, a total pressure of 55 Torr, a hydrogen flow rate of 300 sccm, a $CH_4$ flow rate of 3-30 sccm, and a bias voltage of −125V. The interval time for the bias voltage thus applied was 0-15 minutes. After nucleation of diamond on the silicon base layer was completed, the deposition conditions were changed and were conducted under a microwave power of 1.2 kW, a total pressure of 150 Torr, an Ar flow rate of 200 sccm, a $CH_4$ flow rate of 2-10 sccm, and a silicon base layer temperature of from 450-475° C. for 120-180 minutes so as to produce a UNCD layer with a layer thickness of 2-3 µm. The UNCD layer was then polished in sequence using 3 µm, 1 µm, and 0.5 µm diamond powders. The polished UNCD layer was then cleaned in an acetone solvent for 30 minutes using supersonic cleaning techniques so as to remove particulate materials on the UNCD layer. A piezoelectric layer of AlN with a layer thickness of about 1.5-2 µm was then formed on the cleaned UNCD layer so as to form a SAW substrate using reactive radio frequency magnetron sputtering techniques. The deposition conditions were conducted under an Ar flow rate of 15 sccm, a nitrogen flow rate of 30 sccm, a process pressure of 2 mTorr, and a power of 250 W for 90-120 minutes.

COMPARATIVE EXAMPLE 2

The SAW substrate prepared in this example differs from Comparative Example 1 in that a titanium layer with a layer thickness of about 100 nm was deposited on the cleaned UNCD layer using reactive radio frequency magnetron sputtering techniques prior to the deposition of the aluminum nitride, and that the piezoelectric layer of AlN with a layer thickness of about 1.5-2 µm was then formed on the titanium layer so as to form a SAW substrate. The deposition conditions for the formation of the titanium layer were conducted under a background pressure of $3\times10^{-7}$ Torr, an Ar flow rate of 30 sccm, a process pressure of 2 mTorr, and a power of 300 W for one minute.

EXAMPLE 1

The SAW substrate prepared in this example differs from Comparative Example 2 in that a titanium nitride layer with a layer thickness of about 30 nm was deposited on the titanium layer using reactive radio frequency magnetron sputtering techniques prior to the deposition of aluminum nitride, and that the piezoelectric layer of AlN with a layer thickness of about 1.5-2 µm was then formed on the titanium nitride layer so as to form a SAW substrate. The deposition conditions for the formation of the titanium nitride layer were conducted under a background pressure of $3\times10^{-7}$ Torr, an Ar flow rate of 20 sccm, a nitrogen flow rate of 10 sccm, a process pressure of 2 mTorr, and a power of 300 W for one minute.

EXAMPLE 2

The SAW substrate prepared in this example differs from Example 1 in that the layer thickness of the titanium nitride layer was 150 nm.

Figure 5:
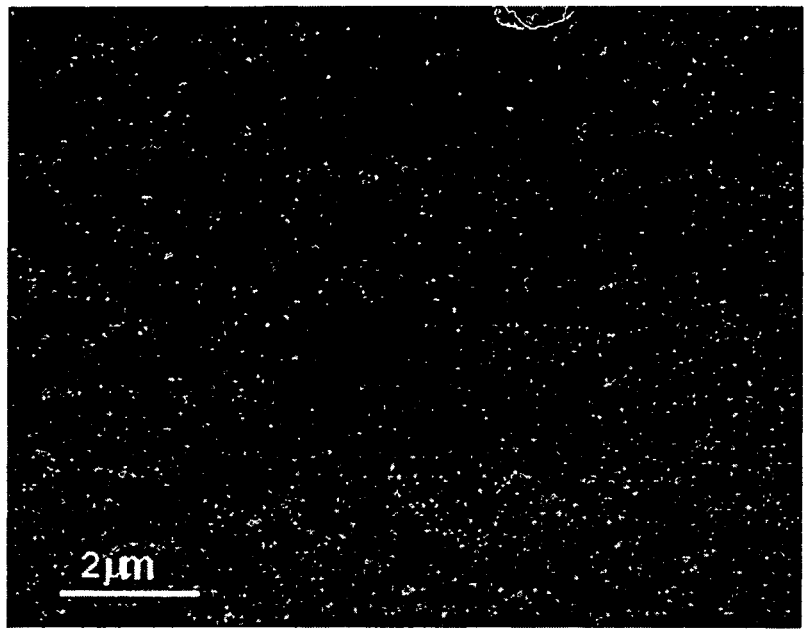
FIG. 5 is a SEM photomicrograph of an aluminum nitride (AlN) layer of the first comparative example which has no buffer layer between a piezoelectric layer and a diamond layer.
Figure 6:
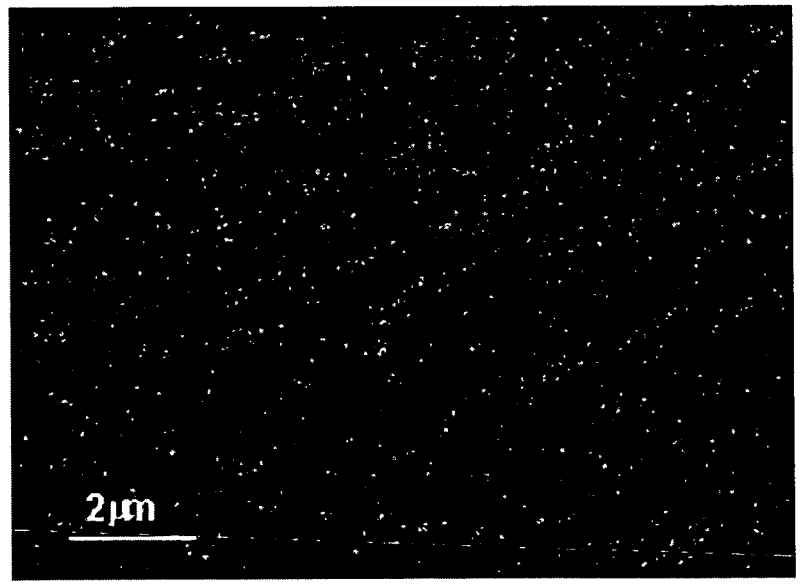
FIG. 6 is a SEM photomicrograph of an aluminum nitride (AlN) layer of the second comparative example which has a titanium layer between a piezoelectric layer and a diamond layer.

FIGS. 3 and 4 are the scanning electron microscopy (SEM) photomicrographs showing the surface roughness of the piezoelectric layer of AlN for Examples 1 and 2, respectively, whereas FIGS. 5 and 6 are SEM photomicrographs showing the surface roughness of the piezoelectric layer of AlN for Comparative Examples 1 and 2. The results show that the surface roughness of the piezoelectric layer 3 of AlN has been considerably improved due to the inclusion of the titanium nitride-based buffer layer 2 in the SAW substrate of this invention.

Figure 7:
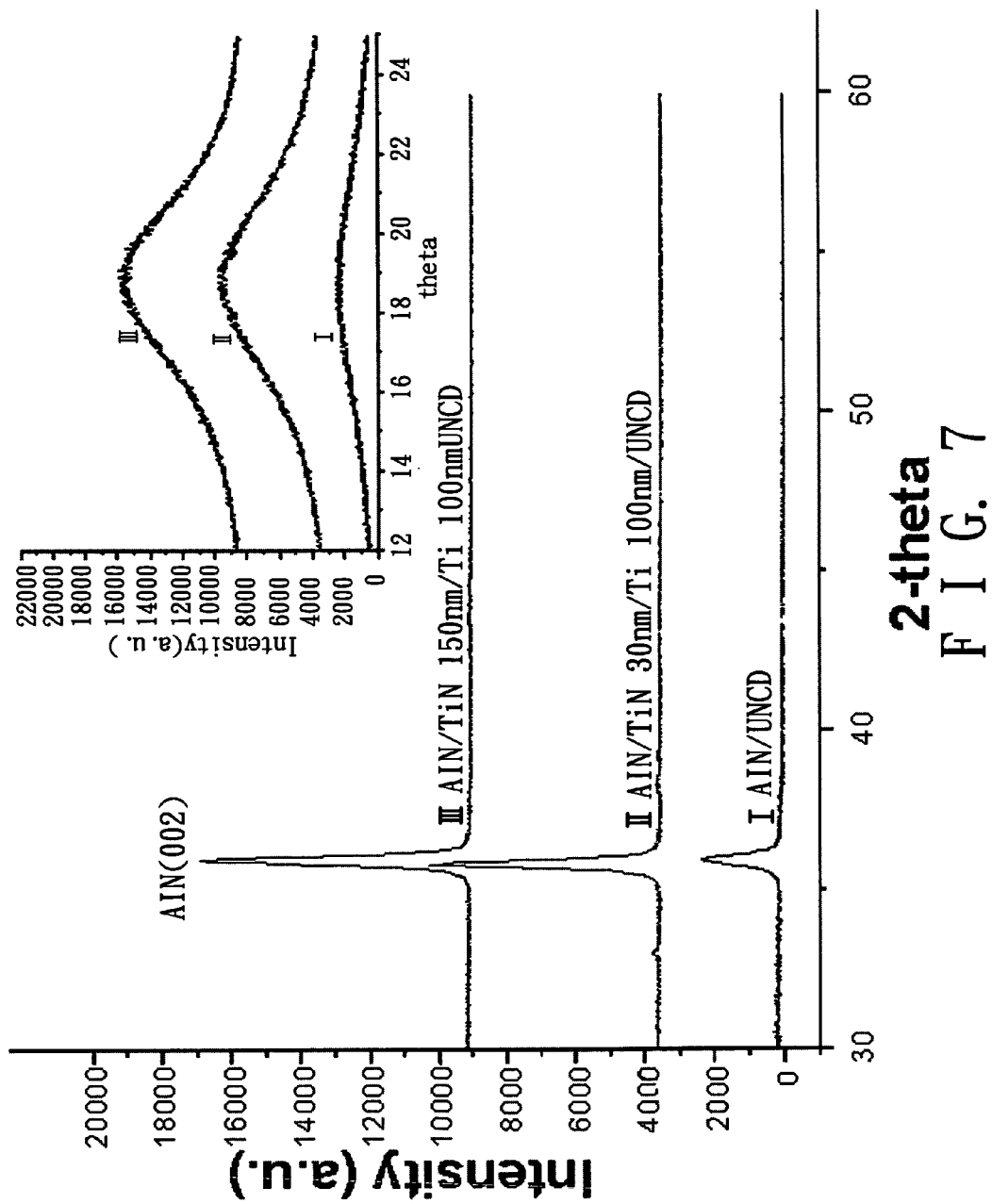
FIG. 7 is a X-ray diffractometer (XRD) graph for the first and second preferred embodiments and the first comparative example.

FIG. 7 show X-ray diffractometer (XRD) patterns for Examples 1 and 2 and Comparative Example 1, respectively. The results show that the (002) orientation or c-axis orientation of the piezoelectric layer 3 of AlN is significantly improved for Examples 1 and 2 as compared to Comparative Example 1. Particularly, the improvement is tremendous when the layer thickness of the second sub-layer 22 of titanium nitride is 150 nm.

FIGS. 8 and 9 show the loading tests using a nanoindentator for Examples 1 and 2 and Comparative Examples 1 and 2. The critical loads that cause cracking for Examples 1 and 2 are 31 mN and 33 mN, respectively, whereas the critical loads for Comparative Examples 1 and 2 are 17 mN and 25 mN, respectively. Note that the higher the critical load the stronger will be the adhesion between the bonded layers.

The results show that the adhesion between the piezoelectric layer 3 and the diamond layer 1 is considerably enhanced with the inclusion of the titanium nitride-based buffer layer 2 in the SAW substrate of this invention.

FIG. 10 shows a SEM photomicrograph of a cross-section of the SAW substrate of Example 2 in a layer thickness direction. The sharp interfaces among layers of the layered structure of the SAW substrate indicate a relatively low interaction between the piezoelectric layer 3 of AlN and the second sub-layer 22 of titanium nitride and a relatively low interaction between the first sub-layer 21 of titanium and the diamond layer 1. Hence, with the inclusion of the titanium nitride-based buffer layer 2 in the SAW substrate of this invention, the interaction between the piezoelectric layer 3 of AlN and the diamond layer 1 can be considerably suppressed.

FIG. 11 is a surface image of the SAW substrate of Example 2 using atomic force microscopy (AFM) for measuring the surface roughness (root mean square, RMS) of the piezoelectric layer of AlN. The results show that the RMS of the piezoelectric layer 3 of AlN of Example 2 is about 9.9 nm. The estimated piezoelectric constant $d_{33}$ is about 4.9 pm/V. Note that the requirement for the values of RMS and $d_{33}$ should be less than 20 nm and greater than 4 pm/V, respectively.

FIG. 12 illustrates a SAW device using the SAW substrate of Example 2 as the substrate thereof. An interdigital transducer (IDT) having 100 pairs of electrodes (each having a linewidth of 3 μm, and an overlapping area of 30λ) is formed on a transducer-forming surface of the piezoelectric layer of AlN of the SAW substrate of Example 2. FIG. 13 shows the insertion loss of the SAW device. The results show that the acoustic velocity of the SAW device reaches 10,200 m/s when the frequency is about 850 MHz, which demonstrates a high acoustic velocity that the SAW device of this invention can provide.

With the inclusion of the titanium nitride-based buffer layer 2 in the SAW substrate of this invention, the aforesaid drawback associated with the prior art can be eliminated.

While the present invention has been described in connection with what is considered the most practical and preferred embodiments, it is understood that this invention is not limited to the disclosed embodiments but is intended to cover various arrangements included within the spirit and scope of the broadest interpretation and equivalent arrangements.

What is claimed is:

1. A surface acoustic wave substrate, comprising:
   a diamond layer;
   a piezoelectric layer of aluminum nitride; and
   a titanium nitride-based buffer layer sandwiched between said diamond layer and said piezoelectric layer.

2. The surface acoustic wave substrate of claim 1, wherein said titanium nitride-based buffer layer includes a first sub-layer of titanium.

3. The surface acoustic wave substrate of claim 2, wherein said titanium nitride-based buffer layer further includes a second sub-layer of titanium nitride sandwiched between said first sub-layer and said piezoelectric layer, said first sub-layer being sandwiched between said diamond layer and said second sub-layer.

4. The surface acoustic wave substrate of claim 3, wherein said first sub-layer has a layer thickness ranging from 10 to 300 nm.

5. The surface acoustic wave substrate of claim 3, wherein said second sub-layer has a layer thickness ranging from 30 to 300 nm.

6. The surface acoustic wave substrate of claim 3, wherein said second sub-layer has a layer thickness ranging from 100 to 200 nm.

7. The surface acoustic wave substrate of claim 3, wherein said aluminum nitride on said titanium nitride based-buffer layer has a (002) oriented crystal structure.

8. The surface acoustic wave substrate of claim 1, wherein said titanium nitride-based buffer layer has a graded structure of titanium nitride.

9. The surface acoustic wave substrate of claim 1, further comprising a N-type silicon layer, said diamond layer being formed on said N-type silicon layer.

\* \* \* \* \*